United States Patent
Zhuang

(10) Patent No.: US 9,380,730 B2
(45) Date of Patent: Jun. 28, 2016

(54) SLANT ANGLE VENT PLATE PATTERN AND METHOD

(71) Applicant: Brocade Communications Systems, Inc., San Jose, CA (US)

(72) Inventor: Pinlin Zhuang, Pleasanton, CA (US)

(73) Assignee: BROCADE COMMUNICATIONS SYSTEMS, INC., San Jose, CA (US)

( * ) Notice: Subject to any disclaimer, the term of this patent is extended or adjusted under 35 U.S.C. 154(b) by 170 days.

(21) Appl. No.: 14/446,994

(22) Filed: Jul. 30, 2014

(65) Prior Publication Data

US 2015/0116935 A1    Apr. 30, 2015

Related U.S. Application Data

(60) Provisional application No. 61/898,331, filed on Oct. 31, 2013.

(51) Int. Cl.
*H05K 7/20* (2006.01)
*H05K 9/00* (2006.01)

(52) U.S. Cl.
CPC .......... *H05K 7/20145* (2013.01); *H05K 9/0041* (2013.01)

(58) Field of Classification Search
CPC .......... H05K 7/20145; H05K 7/20736; H05K 7/20818; H05K 7/20181; H05K 7/20436; H05K 7/20445; H05K 7/20754; H05K 5/0204; H05K 5/0239; H05K 7/20645; H05K 5/06; H05K 7/20; H05K 7/20172; H05K 7/2019; H05K 7/20781; G06F 1/20; G06F 1/203; G06F 1/1601; G06F 1/1656; G06F 1/16; G06F 1/181; H01L 23/40; H01L 23/367; H01L 23/3675; H01L 21/4871; H01L 21/68735; F28D 1/0233; F28D 2021/0028; F24F 1/0014; F24F 1/56; F24F 2013/0616; B63J 2/02; F24D 19/067
USPC .............................. 361/679.51, 692; 454/184
See application file for complete search history.

(56) References Cited

U.S. PATENT DOCUMENTS

| | | | |
|---|---|---|---|
| 3,322,111 A * | 5/1967 | Simpson ............. | F24C 15/2042 126/21 R |
| 6,625,020 B1 * | 9/2003 | Hanson ............. | H05K 7/20581 165/80.3 |
| 6,932,443 B1 | 8/2005 | Kaplan et al. | |
| 7,238,104 B1 | 7/2007 | Greenslade et al. | |
| 7,390,976 B2 | 6/2008 | Liang et al. | |
| 7,529,087 B2 * | 5/2009 | Dubrule .................... | G06F 1/20 361/679.5 |

(Continued)

FOREIGN PATENT DOCUMENTS

EP    2 391 196 A1    11/2011

*Primary Examiner* — Courtney Smith
*Assistant Examiner* — Michael Matey
(74) *Attorney, Agent, or Firm* — Innovation Counsel LLP; Serge J. Hodgson

(57) ABSTRACT

An electronic device includes a chassis base and a chassis cover which define an electronic enclosure. The chassis base includes a slant angle venting plate extending at an angle from a chassis base sidewall of the chassis base. The slant angle venting plate has a slant angle vent plate pattern formed therein. Further, the chassis cover includes a chassis cover venting pattern covering the slant angle vent plate pattern. As the slant angle venting plate is slanted, the available surface area in which to form the slant angle vent plate pattern is maximized thus maximizing air flow through the electronic enclosure.

20 Claims, 5 Drawing Sheets

(56) References Cited

U.S. PATENT DOCUMENTS

| | | | | |
|---|---|---|---|---|
| 8,373,986 B2* | 2/2013 | Sun | ............ | G06F 1/20 |
| | | | | 165/104.33 |
| 8,408,981 B2* | 4/2013 | Su | ............ | F04D 29/441 |
| | | | | 165/104.34 |
| 9,134,036 B2* | 9/2015 | Bagwell | ............ | F24C 15/20 |
| 2006/0148398 A1* | 7/2006 | Ruch | ............ | H05K 5/0213 |
| | | | | 454/184 |
| 2012/0031272 A1* | 2/2012 | Rubit | ............ | B01D 45/06 |
| | | | | 95/287 |
| 2014/0085818 A1* | 3/2014 | Lee | ............ | H05K 5/0213 |
| | | | | 361/690 |
| 2014/0313666 A1* | 10/2014 | Chin | ............ | H05K 7/20972 |
| | | | | 361/692 |
| 2014/0362529 A1* | 12/2014 | Tsuchida | ............ | H05K 7/20181 |
| | | | | 361/690 |

* cited by examiner

SLANT ANGLE VENT PLATE PATTERN AND METHOD

RELATED APPLICATIONS

This application claims the benefit of U.S. Provisional Application No. 61/898,331 filed on Oct. 31, 2013, entitled "SLANT ANGLE PERFORATION VENTING PATTERN AND METHOD" of Pinlin Zhuang, which is incorporated herein by reference in its entirety.

BACKGROUND

1. Field

The present application relates to the field of electronics, and more particularly, to structures for enhancing air flow through an electronic device and related methods.

2. Description of the Related Art

An electronic device typically includes a plurality of electronic components contained within an electronic enclosure. During use, these electronic components generate heat, which must be removed from the electronic enclosure.

In one example, the electronic enclosure includes vertical sidewalls, i.e., that are perpendicular to a base of the electronic enclosure. A venting pattern is formed in one of the vertical sidewalls to allow air flow therethrough. This is an example of a current straight up front panel with hexagonal cutouts for airflow.

However, the size of the openings of the venting pattern must be sufficiently small to provide adequate electromagnetic interference (EMI) shielding. The small size of the openings significantly restricts airflow thus reducing heat removal from the electronic device.

SUMMARY

In accordance with one embodiment, an electronic device includes a chassis base and a chassis cover which define an electronic enclosure. The chassis base includes a chassis base plate, a chassis base sidewall, and a slant angle venting plate. The chassis base sidewall extends perpendicularly from the chassis base plate.

The slant angle venting plate extends at an angle from the chassis base sidewall. The slant angle venting plate has a slant angle vent plate pattern formed therein. Further, the chassis cover includes a chassis cover venting pattern covering the slant angle vent plate pattern.

As the slant angle venting plate is slanted, the available surface area in which to form the slant angle vent plate pattern is increased as compared to the vertical chassis base sidewall. In this manner, the surface area of slant angle vent plate pattern is maximized thus maximizing air flow through the electronic enclosure and cooling of the electronic components contained therein.

Further, the slant angle vent plate pattern is formed with venting perforations, e.g., hexagonal holes or openings. The venting perforations are sufficiently small to provide adequate EMI shielding for the electronic device.

These and other features in accordance with various embodiments will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
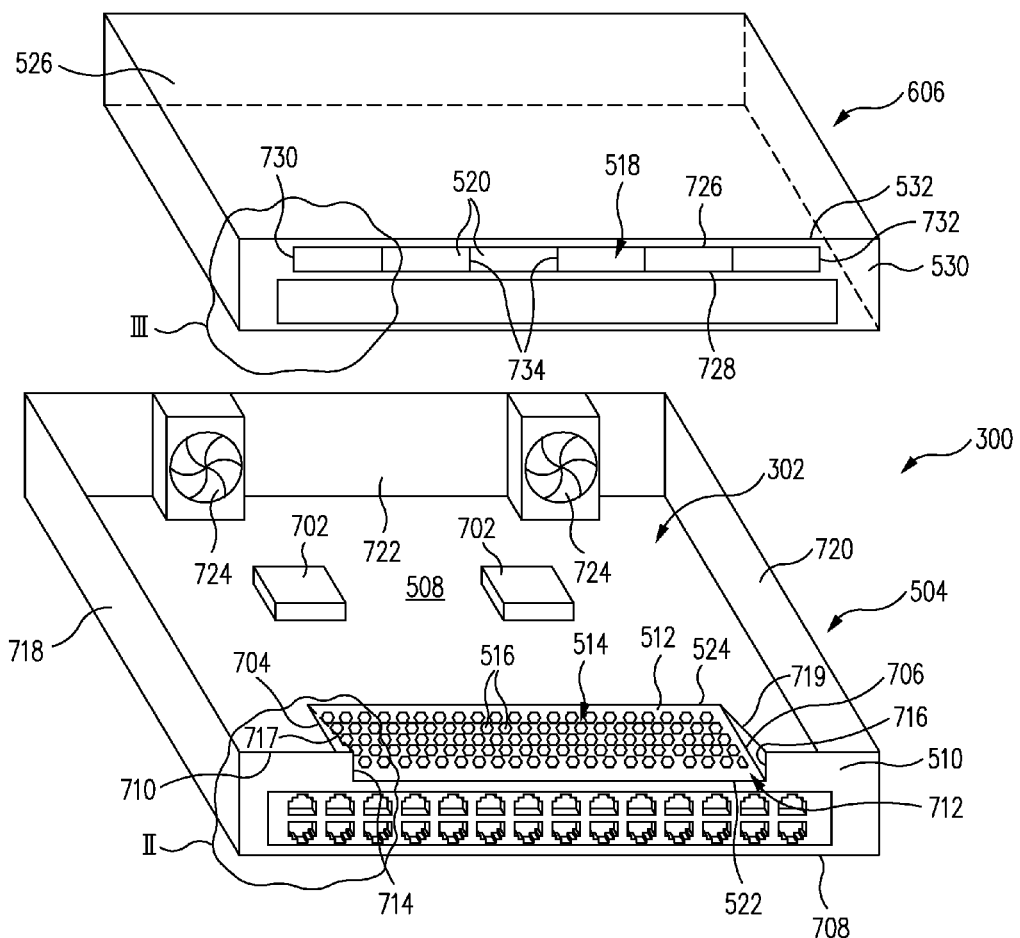
FIG. 1 is a front exploded perspective view of an electronic device having a slant angle vent plate pattern in accordance with one embodiment.
Figure 2:
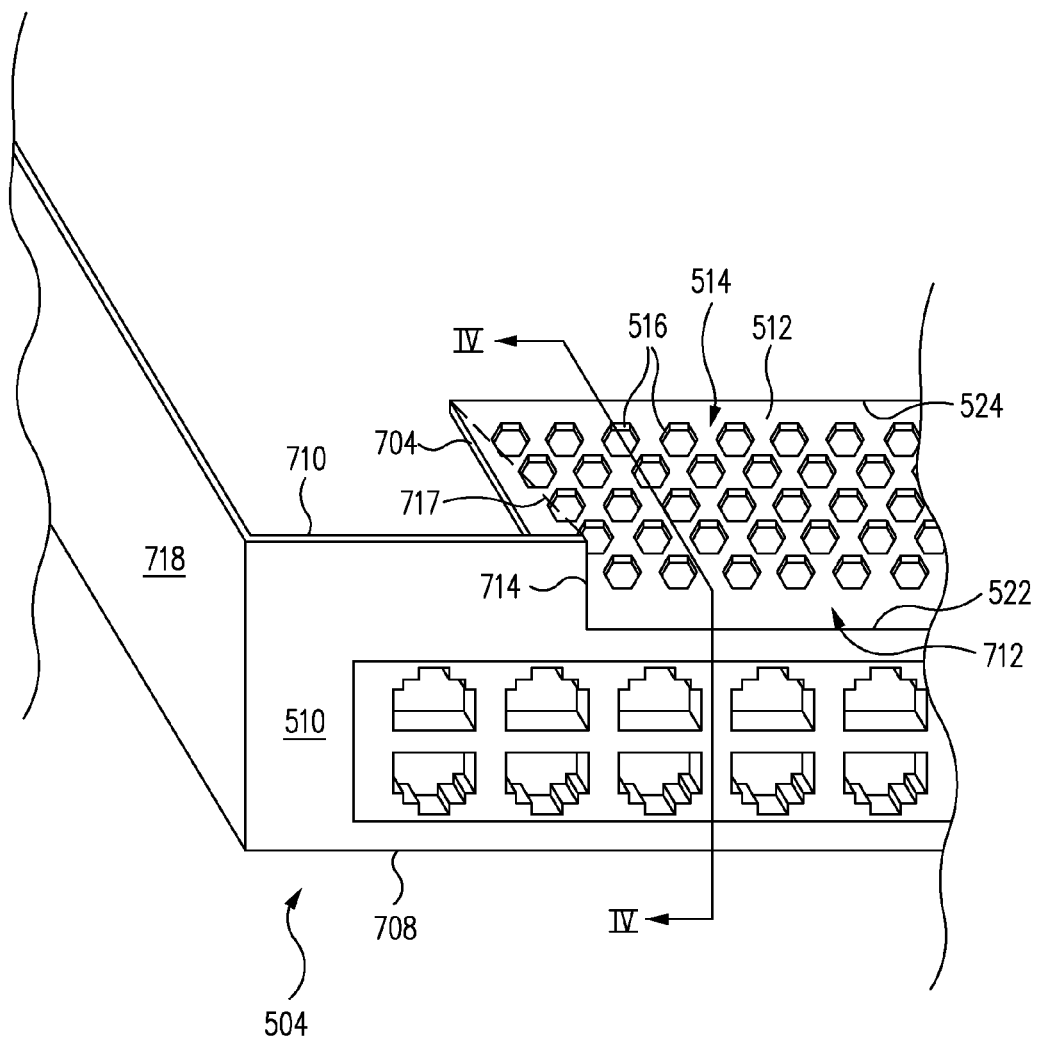
FIG. 2 is an enlarged view of the region II of a chassis base of the electronic device of FIG. 1 in accordance with one embodiment.
Figure 3:
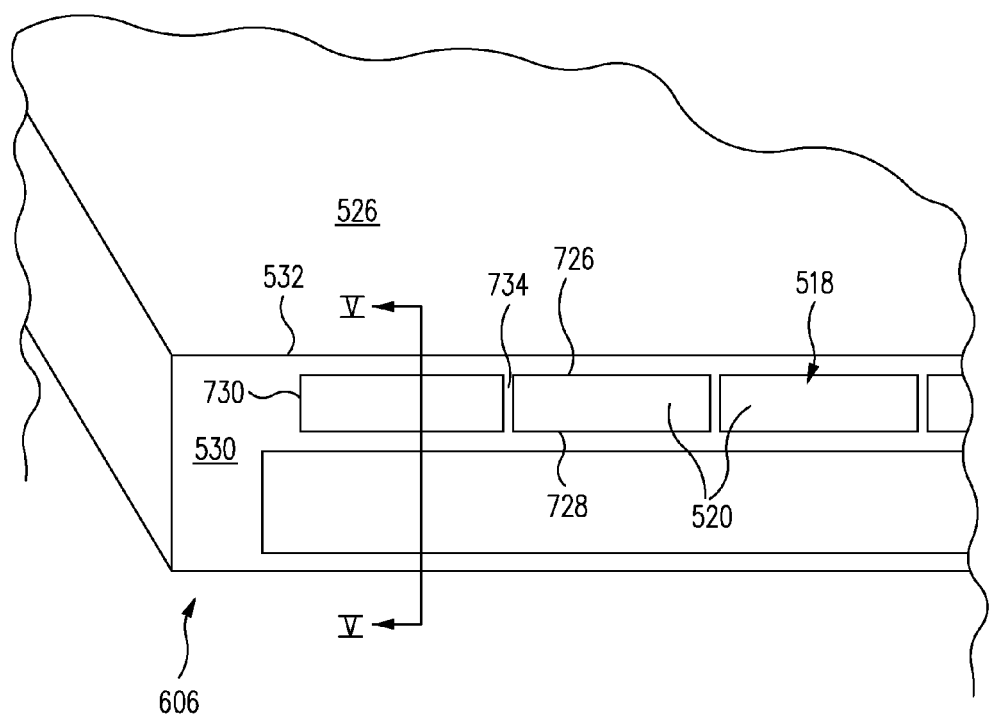
FIG. 3 is an enlarged view of the region III of a chassis cover of the electronic device of FIG. 1.
Figure 5:
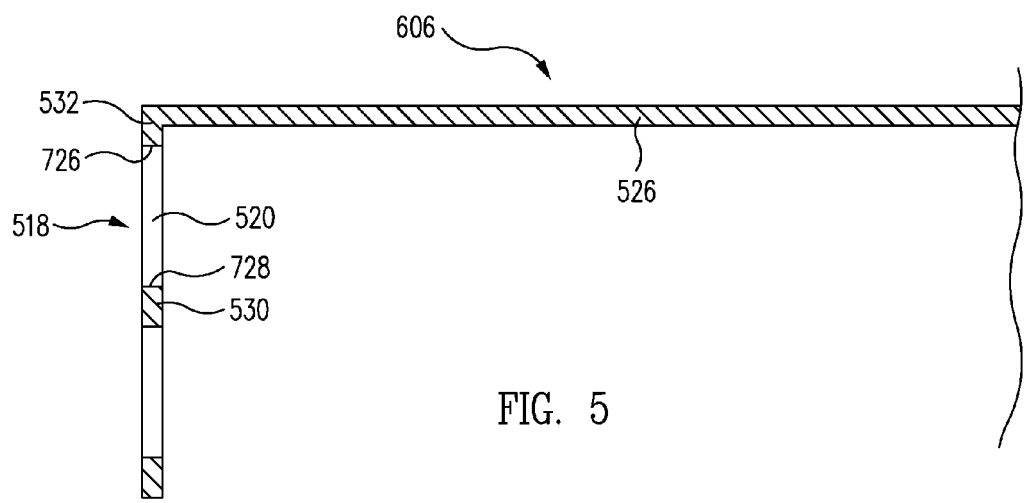
FIG. 5 is a cross-sectional view along the line V-V of the chassis cover of FIG. 3 in accordance with one embodiment.
Figure 4:
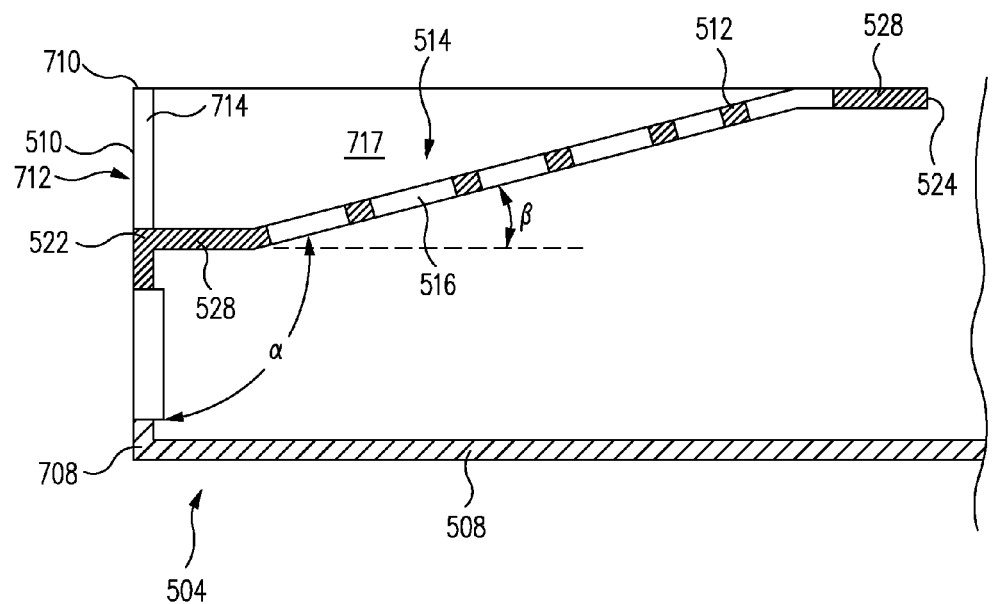
FIG. 4 is a cross-sectional view along the line IV-IV of the chassis base of FIG. 2 in accordance with one embodiment.
Figure 6:
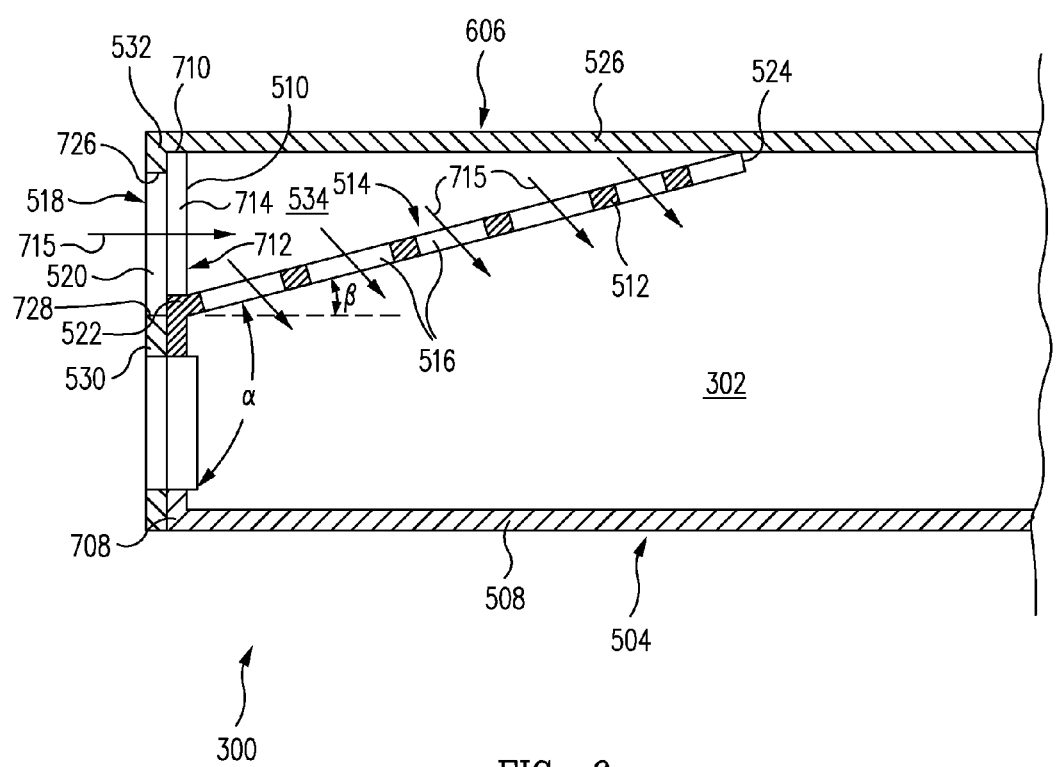
FIG. 6 is a cross-sectional view of the electronic device of FIG. 1 assembled in accordance with one embodiment.

FIG. 1 is a front exploded perspective view of an electronic device 300 having a slant angle vent plate pattern 514 in accordance with one embodiment. FIG. 2 is an enlarged view of the region II of a chassis base 504 of electronic device 300 of FIG. 1 in accordance with one embodiment. FIG. 3 is an enlarged view of the region III of a chassis cover 606 of electronic device 300 of FIG. 1. FIG. 4 is a cross-sectional view along the line IV-IV of chassis base 504 of FIG. 2 in accordance with one embodiment. FIG. 5 is a cross-sectional view along the line V-V of chassis cover 606 of FIG. 3 in accordance with one embodiment. FIG. 6 is a cross-sectional view of electronic device 300 of FIG. 1 assembled in accordance with one embodiment.

Referring now to FIGS. 1-6 together, electronic device 300, e.g., a switch, includes an electronic enclosure 302 including chassis base 504 and chassis cover 606. Chassis base 504 includes a horizontal chassis base plate 508 and a vertical chassis base sidewall 510. Chassis base sidewall 510 is perpendicular to chassis base plate 508 in accordance with this embodiment.

In one embodiment, chassis base plate 508 is horizontal, e.g., extends in a first direction. Chassis base sidewall 510 extends vertically upwards, e.g., in a second direction perpendicular to the first direction of chassis base plate 508. Although the terms horizontal and vertical are used herein for simplicity, it is to be understood that the terms are not gravitationally referenced but mean a first direction and a perpendicular second direction.

Chassis base 504 further includes a slant angle venting plate 512, sometimes called a slant front, extending at an angle $\alpha$ (see FIGS. 4, 6), sometimes called slanting, inward from chassis base sidewall 510. Inward means toward the volume defined by electronic enclosure 302 and outwards means away from the volume defined by electronic enclosure 302. Slant angle vent plate pattern 514 is formed in slant angle venting plate 512

In one embodiment, angle $\alpha$ is the angle between chassis base sidewall 510 and slant angle venting plate 512. More particularly, angle $\alpha$ is the obtuse angle of intersection between a plane parallel to chassis base sidewall 510 and a plane parallel to slant angle venting plate 512. Generally, angle $\alpha$ is greater than 90° (ninety degrees) but less than 180° (one hundred eighty degrees).

In one embodiment, angle $\alpha$ is the smallest angle possible within the range of 90° to 180° to maximize the available surface area in which to form slant angle vent plate pattern 514. However, the slant angle is increased depending upon the design of the particularly system assembly, e.g., to provide space for electronic components 702 of electronic device 300.

In one particular embodiment, angle α is within the range of 106.7° to 120.6° to accommodate the system assembly. For example, angle α is 106.7°.

In one example, an angle β of slant angle venting plate 512 from the horizontal is defined (see FIGS. 4, 6). Specifically, angle β is the angle between the horizontal, e.g., a plane parallel to horizontal lips 528 and chassis base plate 508, and a plane parallel to slant angle venting plate 512. Angle β is equal to angle α−90°, i.e., β=α−90°.

Paying particular attention to FIGS. 1, 2, 4, and 6 together, in one embodiment, slant angle venting plate 512 is connected to chassis base sidewall 510 along a chassis base sidewall slant angle venting plate edge 522. Slant angle venting plate 512 extends inward and upward from chassis base sidewall slant angle venting plate edge 522 to a chassis cover slant angle venting plate edge 524.

Chassis cover slant angle venting plate edge 524 is directly adjacent a horizontal cover plate 526 of chassis cover 606 when chassis cover 606 is mounted to chassis base 504 as illustrated in FIG. 6. Slant angle venting plate 512 may not be entirely planar but may include horizontal lips 528 at edges 522, 524 of slant angle venting plate 512. Although horizontal lips 528 are illustrated in FIG. 4, in another embodiment, slant angle venting plate 512 is entirely planar and horizontal lips 528 are not provided for example as illustrated in FIG. 6.

Slant angle venting plate 512 further includes side edges 704, 706. Side edges 704, 706 extend from chassis base sidewall 510 at chassis base sidewall slant angle venting plate edge 522 to chassis cover slant angle venting plate edge 524.

Chassis base sidewall 510 includes a chassis base plate edge 708 at chassis base plate 508. Chassis base sidewall 510 extends vertically upward from chassis base plate edge 708 to an uppermost chassis cover edge 710. In one embodiment, chassis cover edge 710 and chassis cover slant angle venting plate edge 524 lie within a common plane parallel to chassis base plate 508.

Chassis base sidewall 510 further includes a slant angle venting plate opening 712. Slant angle venting plate opening 712 is an opening in chassis base sidewall 510 that is aligned with and corresponds to slant angle venting plate 512.

Slant angle venting plate opening 712 is defined by chassis base sidewall slant angle venting plate edge 522 and slant angle venting plate opening edges 714, 716. Slant angle venting plate opening edges 714, 716 extend vertically upward from chassis base sidewall slant angle venting plate edge 522 to chassis cover edge 710.

In one embodiment, slant angle venting plate sidewalls 717, 719 are provided to seal the sides of slant angle venting plate 512. Slant angle venting plate sidewall 717 is indicated with a dashed line in FIGS. 1-2 to allow visualization of features that would otherwise be obscured by slant angle venting plate sidewall 717 in the view of FIGS. 1-2.

Slant angle venting plate sidewalls 717, 719 extend inward from slant angle venting plate opening edges 714, 716 to side edges 704, 706, respectively. Slant angle venting plate sidewalls 717, 719 extend perpendicularly inward from chassis base sidewall 510. The upper edges of slant angle venting plate sidewalls 717, 719 are parallel to chassis base plate 508 in one embodiment. By sealing the sides of slant angle venting plate 512, airflow and EMI passing around instead of through slant angle venting plate 512 is prevented.

Chassis base sidewall 510 is sometimes called a front plate 510. In accordance with this embodiment, chassis base 504 further includes a first sidewall 718, a second sidewall 720, and a rear plate or face 722. Chassis base sidewall 510, first sidewall 718, second sidewall 720, and rear plate 722, sometimes called chassis base sidewalls, extend perpendicularly vertically upwards from chassis base plate 508.

First sidewall 718 and second sidewall 720 extend perpendicularly from chassis base sidewall 510 to rear plate 722. First sidewall 718 and second sidewall 720 are parallel to one another. Chassis base sidewall 510 and/or rear plate 722 include various ports, components, or other structures in accordance with various embodiments.

One or more electronic components 702 are mounted to chassis base plate 508 and within electronic enclosure 302. For example, electronic components 702 are mounted to a printed circuit board and are part of a printed circuit board assembly. The printed circuit board assembly including electronic components 702 is mounted to chassis base plate 508. However, in other embodiments, electronic components 702 are directly mounted to chassis base 504 or mounted to other structures that are mounted to chassis base 504.

During operation, electronic components 702 generate heat. This heat is removed from electronic enclosure 302 by airflow through slant angle vent plate pattern 514 as discussed further below. In one embodiment, electronic device 300 includes one or more fans 724, e.g., fan field replaceable units (fan FRUs), that move air through electronic device 300 between chassis base sidewall 510 and rear plate 722 or vice versa. In another embodiment, instead of being fan FRUs, fans 724 are fixed in position.

Chassis cover 606 further includes one or more cover sidewalls 530 extending vertically downward from cover plate 526 at cover plate sidewall edges 532. As illustrated in FIG. 6, chassis cover 606 is mounted to chassis base 504, e.g., using screws, mechanical fasteners, or other means, to form electronic enclosure 302. Once chassis cover 606 is mounted, cover sidewall 530 is parallel to, covers, overlaps, and is directly adjacent to chassis base sidewall 510.

Chassis cover edge 710 is directly adjacent, e.g., contacts, cover plate 526 at cover plate sidewall edge 532. Chassis cover edge 710 is directly adjacent to cover plate sidewall edge 532 in accordance with this embodiment.

In one embodiment, in the cross-sectional view of FIG. 6, slant angle venting plate 512 is the hypotenuse (the longest side) of a right-angle triangle 534 defined by edges 522, 524, 532/710. By knowing angle α and the length between edges 522, 532/710, the length of slant angle venting plate 512 is readily calculated as those of skill in the art will understand in light of this disclosure.

As slant angle venting plate 512 is slanted, the available surface area in which to form slant angle vent plate pattern 514 is increased as compared to chassis base sidewall 510. More particularly, instead of having only the area between edges 522 and 532/710, the greater area between edges 522 and 524 of slant angle venting plate 512 is used to form slant angle vent plate pattern 514. In this manner, the surface area of slant angle vent plate pattern 514 is maximized thus maximizing air flow through electronic enclosure 302.

Further, slant angle vent plate pattern 514 is formed with venting perforations 516, e.g., hexagonal holes or openings. Venting perforations 516 are sufficiently small to provide adequate EMI shielding for electronic device 300. In one embodiment, venting perforations 516 are punched perpendicular to and extend perpendicularly through slant angle venting plate 512. Further, venting perforations 516 can have shapes other than rectangular, e.g., can be a plurality of large polygon or curved openings.

Further, chassis cover 606 is formed with a rectangular cutout venting pattern 518, sometimes called a chassis cover venting pattern 518. Rectangular cutout venting pattern 518 is formed of large rectangular perforations 520, e.g., rectangular holes or openings, sometimes called cutouts, in cover sidewall 530. In one embodiment, rectangular perforations 520 are much larger than venting perforations 516.

Rectangular cutout venting pattern 518 covers slant angle vent plate pattern 514 such that air readily flows through rectangular cutout venting pattern 518 and slant angle vent plate pattern 514 as indicated by the arrows 715 in FIG. 6. The large rectangular perforations 520 insure adequate airflow through electronic enclosure 302.

Rectangular cutout venting pattern 518 in chassis cover 606 is similar in size, if not identical to, slant angle venting plate opening 712. Rectangular cutout venting pattern 518 is defined by an upper edge 726, a lower edge 728, a first side edge 730, and a second side edge 732. Upper edge 726, lower edge 728, and cover plate sidewall edge 532 are horizontal, parallel to one another, and lie within the plane of cover sidewall 530. Side edges 730, 732 extend vertically upward from lower edge 728 to upper edge 726.

Vertical support members 734 of chassis cover 606 extend vertically upwards from lower edge 728 to upper edge 726. Rectangular perforations 520 are defined by side edge 730, upper edge 726, lower edge 728, vertical support members 734, and side edge 732.

Vertical support members 734 are optional, and in one embodiment, are not formed. In accordance with the embodiment where vertical support members 734 are not formed, rectangular cutout venting pattern 518 includes one large rectangular opening defined by edges 726, 728, 730, and 732. Further, rectangular cutout venting pattern 518 can have shapes other than rectangular, e.g., can be a plurality of large polygon or curved openings.

Rectangular cutout venting pattern 518 is placed over and aligned with slant angle venting plate opening 712 when chassis cover 606 is mounted to chassis base 504 as illustrated in FIG. 6. More particularly, lower edge 728 of rectangular cutout venting pattern 518 of chassis cover 606 is aligned with chassis base sidewall slant angle venting plate edge 522.

Accordingly, air flows through rectangular cutout venting pattern 518, through slant angle venting plate opening 712, and through slant angle vent plate pattern 514 and slant angle venting plate 512 as indicated by the arrows 715.

In one embodiment, venting perforations 516 and rectangular perforations 520 provide increased airflow in the range of approximately 24%-100% than a venting pattern formed in a vertical chassis base sidewall.

Illustratively, chassis cover 606 is customized in appearance for each customer to which electronic device 300 is to be sold. However, chassis base 504 including the electronic components 702 contained therein is the same part for each customer. In this manner, a customer specific appearance of electronic device 300 for each customer is readily provided simply by changing the external appearance of chassis cover 606.

The drawings and the forgoing description gave examples of embodiments. The scope of the embodiments, however, is by no means limited by these specific examples. Numerous variations, whether explicitly given in the specification or not, such as differences in structure, dimension, and use of material, are possible.

What is claimed is:

1. An electronic device comprising:
  a chassis base comprising:
    a chassis base plate;
    a chassis base sidewall extending perpendicularly from the chassis base plate, the chassis base sidewall comprising a slant angle venting plate opening, the slant angle venting plate opening being defined by a chassis base sidewall slant angle venting plate edge and slant angle venting plate opening edges extending from the chassis base sidewall slant angle venting plate edge to a chassis cover edge of the chassis base sidewall; and
    a slant angle venting plate extending at an angle from the chassis base sidewall, the slant angle venting plate having a slant angle vent plate pattern formed therein; and a chassis cover comprising a chassis cover venting pattern, the chassis cover venting pattern covering the slant angle vent plate pattern.

2. The electronic device of claim 1 wherein the angle is within a range of greater than 90° to less than 180°.

3. The electronic device of claim 2 wherein the angle is within the range of 106.7° to 120.6°.

4. The electronic device of claim 2 wherein the angle is 106.7°.

5. The electronic device of claim 1 wherein the angle is the obtuse angle of intersection between a plane parallel to the chassis base sidewall and a plane parallel to the slant angle venting plate.

6. The electronic device of claim 1 wherein the chassis cover is coupled to the chassis base.

7. The electronic device of claim 1 wherein the chassis base and the chassis cover define an electronic enclosure.

8. The electronic device of claim 7 further comprising an electronic component located within the electronic enclosure.

9. The electronic device of claim 1 wherein the slant angle venting plate is coupled to the chassis base sidewall along the chassis base sidewall slant angle venting plate edge.

10. An electronic device comprising:
  a chassis base comprising:
    a chassis base sidewall comprising a slant angle venting plate opening; and
    a slant angle venting plate extending at an angle from the chassis base sidewall, the slant angle venting plate having a slant angle vent plate pattern formed therein; and
  a chassis cover comprising a cover sidewall parallel and directly adjacent to the chassis base sidewall, the cover sidewall comprising a chassis cover venting pattern aligned with the slant angle venting plate opening.

11. The electronic device of claim 10 wherein the slant angle venting plate opening is aligned with the slant angle venting, plate.

12. The electronic device of claim 10 wherein the slant angle venting plate opening is defined by a chassis base sidewall slant angle venting plate edge.

13. The electronic device of claim 12 wherein the slant angle venting plate is connected to the chassis base sidewall along the chassis base sidewall slant angle venting plate edge.

14. The electronic device of claim 13 wherein the slant angle venting plate extends from the chassis base sidewall slant angle venting plate edge to a chassis cover slant angle venting plate edge.

15. The electronic device of claim 14 wherein the chassis cover comprises a cover plate, the chassis cover slant angle venting plate edge being directly adjacent to the cover plate.

16. The electronic device of claim 15 wherein the cover sidewall extends perpendicularly from the cover plate.

17. The electronic device of claim 16 wherein the chassis base comprises a chassis base plate, the chassis base sidewall extending perpendicularly from the chassis base plate.

18. A method comprising:
  forming an electronic enclosure with a chassis base and a chassis cover;
  generating heat with an electronic component located within the electronic enclosure; and removing the heat from the electronic enclosure comprising:

causing air to flow through a chassis cover venting pattern in the chassis cover;

causing the air to flow through a slant angle venting plate opening in a chassis base sidewall of the chassis base; and causing the air to flow through a slant angle vent plate pattern of a slant angle venting plate of the chassis base, the slant angle venting plate extending at an angle from the chassis base sidewall of the chassis base.

19. The method of claim 18 wherein the slant angle vent plate pattern comprises venting perforations.

20. The method of claim 19 further comprising providing electromagnetic interference (EMI) shielding with the venting perforations.

* * * * *